(12) United States Patent
Qin et al.

(10) Patent No.: US 12,114,440 B2
(45) Date of Patent: Oct. 8, 2024

(54) DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Lijun Qin, Wuhan (CN); Chihshun Tang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/600,058

(22) PCT Filed: Aug. 3, 2021

(86) PCT No.: PCT/CN2021/110175
§ 371 (c)(1),
(2) Date: Sep. 29, 2021

(87) PCT Pub. No.: WO2023/000379
PCT Pub. Date: Jan. 26, 2023

(65) Prior Publication Data
US 2024/0049409 A1 Feb. 8, 2024

(30) Foreign Application Priority Data
Jul. 22, 2021 (CN) .......................... 202110828691.4

(51) Int. Cl.
*H05K 5/02* (2006.01)
*H05K 7/20* (2006.01)

(52) U.S. Cl.
CPC ....... *H05K 5/0217* (2013.01); *H05K 7/20963* (2013.01)

(58) Field of Classification Search
CPC .. H05K 7/20963; H05K 5/0217; G09F 9/301; G06F 1/20; G06F 1/1652
See application file for complete search history.

(56) References Cited

U.S. PATENT DOCUMENTS

| 2006/0098412 A1* | 5/2006 | Kim ................... H05K 7/20963 361/704 |
| 2006/0232919 A1* | 10/2006 | Jeong ................ H05K 7/20972 361/679.22 |

(Continued)

FOREIGN PATENT DOCUMENTS

| CN | 108877519 A | * 11/2018 | ............. G09F 9/301 |
| CN | 109375408 A | * 2/2019 | ......... G02F 1/13306 |

(Continued)

OTHER PUBLICATIONS

Luo et al; 'Array substrate, manufacturing method and display panel', Jul. 26, 2019, BOE Technology Group Co Ltd; Chengdu BOE Optoelect Tech Co, Description (Espacenet Machine Translation of CN 110060574 A) (Year: 2019).*

(Continued)

*Primary Examiner* — Stephen S Sul
*Assistant Examiner* — Jeffrey Francis Stoll
(74) *Attorney, Agent, or Firm* — PV IP PC; Wei Te Chung

(57) ABSTRACT

The present application provides a display device. The display device includes a display panel, an adhesive layer, and a heat dissipation buffer layer. The adhesive layer in the present application is arranged between a display portion and a bonding portion. The heat dissipation buffer layer is arranged at one side of the display portion of the display panel facing the bonding portion. A projection of the heat (Continued)

dissipation buffer layer projected on the display portion does not overlap a projection of the adhesive layer projected on the display portion.

8 Claims, 1 Drawing Sheet

(56) References Cited

U.S. PATENT DOCUMENTS

| | | | |
|---|---|---|---|
| 2019/0014671 A1* | 1/2019 | Ahn | H05K 1/028 |
| 2020/0022261 A1* | 1/2020 | Choi | H10K 59/131 |
| 2020/0194712 A1* | 6/2020 | Choi | H10K 59/12 |
| 2021/0124197 A1* | 4/2021 | Wang | G02F 1/133305 |
| 2021/0337682 A1* | 10/2021 | Zhu | H05K 5/0217 |
| 2021/0407334 A1* | 12/2021 | Feng | H10K 59/131 |
| 2022/0310964 A1* | 9/2022 | Xia | H10K 59/8794 |
| 2022/0312654 A1* | 9/2022 | Zhang | G06F 1/1637 |
| 2023/0171931 A1* | 6/2023 | Qian | H05K 1/189 |
| | | | 361/679.01 |

FOREIGN PATENT DOCUMENTS

| | | | | |
|---|---|---|---|---|
| CN | 109410767 A | * | 3/2019 | G06F 1/1652 |
| CN | 110060574 A | * | 7/2019 | G09F 9/301 |
| CN | 111462634 A | * | 7/2020 | G09F 9/301 |
| CN | 112289185 A | | 1/2021 | |
| CN | 112634764 A | | 4/2021 | |
| EP | 3346514 A1 | * | 7/2018 | H01L 27/323 |
| KR | 2020124483 A | * | 11/2020 | |
| KR | 2020129646 A | * | 11/2020 | |

OTHER PUBLICATIONS

Qian et al; 'Display device', Nov. 23, 2018, Shanghai Tianma Microelectronics Co Ltd, Description (Espacenet Machine Translation of CN 108877519 A) (Year: 2018).*
Min, Byeongjo; "Display Having Heat Radiation Seat And Bending Fixing Member", Nov. 18, 2020, LG Display Co Ltd, Description (Translation of KR 20200129646 A) (Year: 2020).*
Bae, Muno et al; "Display Using Heat Radiation Member", Nov. 3, 2020, LG Display Co Ltd, Description (Translation of KR 20200124483 A) (Year: 2020).*
Chinese Office Action in corresponding Chinese Patent Application No. 202110828691.4 dated Dec. 23, 2021, pp. 1-7.

* cited by examiner

DISPLAY DEVICE

RELATED APPLICATIONS

This application is a Notional Phase of PCT Patent Application No. PCT/CN2021/110175 having international filing date of Aug. 3, 2021, which claims the benefit of priority of Chinese Patent Application No. 202110828691.4 filed on Jul. 22, 2021. The contents of the above applications are all incorporated by reference as if fully set forth herein in their entirety.

FIELD OF DISCLOSURE

The present application relates to a field of display technology and in particular, to a display device.

DESCRIPTION OF RELATED ART

With development of electronic devices, there has been a trend towards narrower bezels. However, wiring arrangements of flexible printed circuit boards (abbreviated as: FPC) and GOA at lower border regions restrict the development of narrow bezels for mobile phones.

Technical Problem

At present, lines of FPCs and GOAs are bent to a back of a screen body through a bending process, as shown in FIG. 1. Conventional display devices comprise a display region and a bending region. The bending region mainly comprises a first backplate (BP1, with a thickness H1), a heat dissipation buffer layer (SCF, with a thickness H2), an adhesive layer (i.e., a stiffener, with a thickness H3), and a second backplate (BP2, with a thickness H4). It can be understood that the less a bending radius R, the less a border length (L1+R) of a lower boundary area. When the bending radius R is less, a thickness H (2R=H=H1+H2+H3+H4) of a module structure in a bending area is also required to be less. However, in order to satisfy material requirements for a product, there is a limit to thinning of the thickness H of the module structure. Due to this limitation, thicknesses H of products on the market is basically 0.5 mm to 0.7 mm (the corresponding bending radius R is 0.25 mm to 0.35 mm).

Therefore, there is a need to provide a new display device to solve the above-mentioned problems.

SUMMARY

An objective of the present application is to provide a display device to solve a problem that there is a limit to thinning of a thickness H of a conventional module structure, and therefore, a bending radius R cannot be reduced.

The present application provides a display device, comprising:
- a display panel comprising a display portion, a bonding portion bent to a back of the display panel, and a bending portion connecting the display portion and the bonding portion;
- an adhesive layer disposed between the display portion and the bonding portion; and
- a heat dissipation buffer layer disposed at one side of the display portion of the display panel facing the bonding portion;
- wherein a projection of the heat dissipation buffer layer projected on the display portion does not overlap a projection of the adhesive layer projected on the display portion.

Furthermore, the heat dissipation buffer layer is arranged at one side of the adhesive layer away from the bending portion.

Furthermore, the display device further comprises: a first backplate disposed between the adhesive layer and the display portion; and a second backplate disposed between the adhesive layer and the bonding portion; wherein the adhesive layer is disposed between the first backplate and the second backplate.

Furthermore, a bending radius of the bending portion is r, a film thickness of the adhesive layer is h1, a film thickness of the first backplate is h2, a film thickness of the second backplate is h3, and h1+h2+h3=2r.

Moreover, h1+h2+h3<0.5 mm.

Furthermore, the adhesive layer comprises a first adhesive layer disposed between the display portion and the bonding portion.

Moreover, the adhesive layer further comprises: a second adhesive layer disposed between the first adhesive layer and the display portion; and an intermediate layer disposed between the first adhesive layer and the second adhesive layer; wherein a material of the intermediate layer comprises one of thermoplastic polyester or foam.

Furthermore, the first backplate comprises: a first substrate disposed between the adhesive layer and the display portion; and a first polyester layer disposed between the first substrate and the display portion.

Furthermore, the second backplate comprises: a second substrate disposed between the adhesive layer and the bonding portion; and a second polyester layer disposed between the second substrate and the bonding portion.

Furthermore, the display device further comprises a third adhesive layer disposed on the bending portion, a portion of the display portion, and a portion of the bonding portion.

Advantages of the Present Application

The present application provides a display device. An adhesive layer in the present application is disposed between a display portion and a bonding portion. A heat dissipation buffer layer is disposed at one side of the display portion of the display panel facing the bonding portion. A projection of the heat dissipation buffer layer projected on the display portion does not overlap a projection of the adhesive layer projected on the display portion. Therefore, a bending diameter of the display device of the present application is equal to a sum of thicknesses of a first backplate, a second backplate, and an adhesive layer. The bending diameter of the display device of the present application is less than 0.5 mm. In conventional techniques, a bending diameter is equal to a sum of thicknesses of a first backplate, a second backplate, an adhesive layer, and a heat dissipation buffer layer. In contrast, the bending diameter of the display device of the present application does not need to consider a thickness of the heat dissipation buffer layer of the present application. Accordingly, a bending radius of the display device of the present application is less than a bending radius of a conventional display device. As a result, a bezel width of the display device can be reduced to realize narrow bezels and improve product competitiveness.

BRIEF DESCRIPTION OF DRAWINGS

The present application is described in detail below in conjunction with the accompanying drawings for ease of understanding of the technical solutions and other advantages of the present application.

Figure 1:
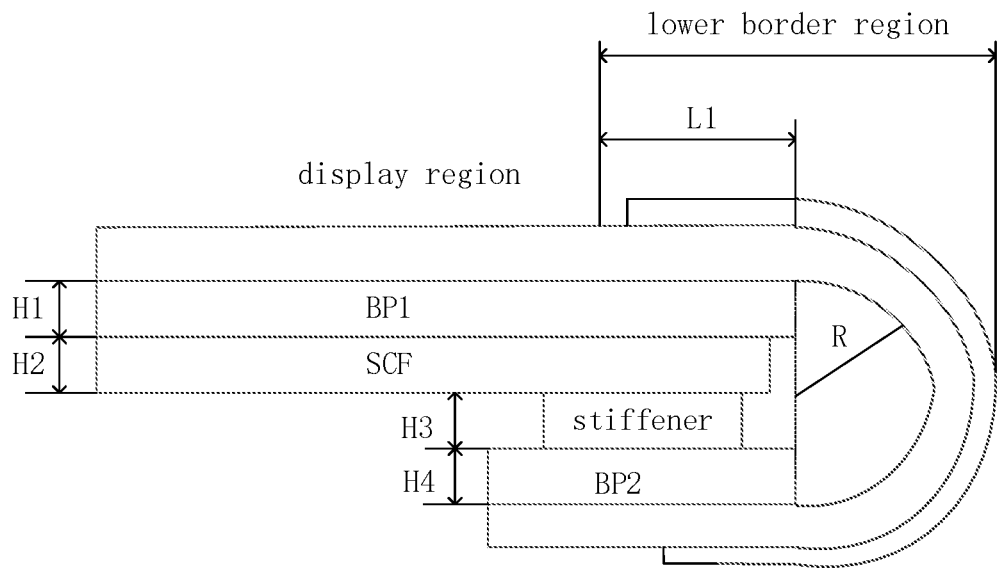
FIG. 1 is a schematic structural view illustrating a conventional display device.

display device 100; display panel 101; adhesive layer 103; display portion 1011; bonding portion 1013; bending portion 1012;
first backplate 102; second backplate 104; heat dissipation buffer layer 106;
third adhesive layer 105.

DETAILED DESCRIPTION OF EMBODIMENTS

The technical solutions in the present application will be clearly and completely described below in conjunction with the accompanying drawings and with reference to specific embodiments. Obviously, the described embodiments are only some of the embodiments of the present application, rather than all the embodiments. Based on the embodiments in the present application, all other embodiments obtained by those skilled in the art without creative work shall fall within the protection scope of the present application.

Figure 2:
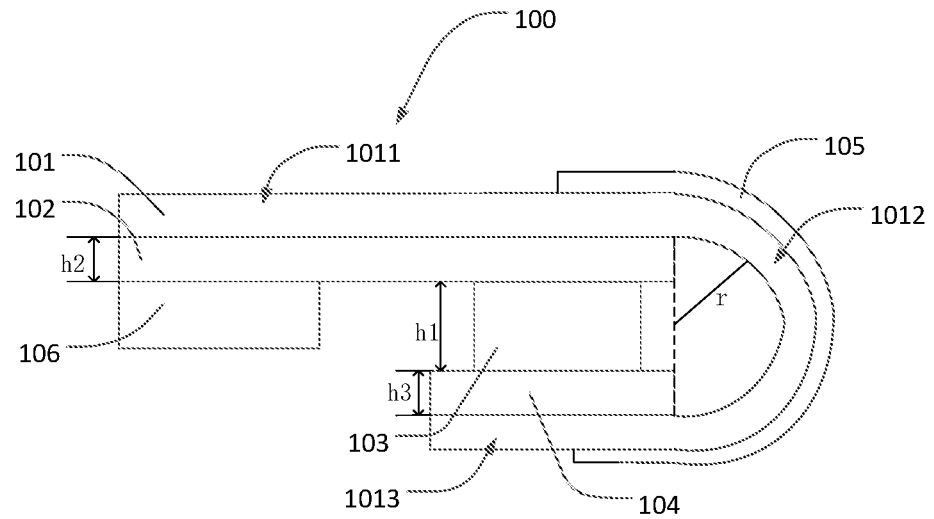
FIG. 2 is a schematic structural view illustrating a display device according to one embodiment of the present application.

As shown in FIG. 2, the present application provides a display device 100, comprising a display panel 101, a first backplate 102, an adhesive layer 103, a second backplate 104, a third adhesive layer 105, and a heat dissipation buffer layer 106.

The display panel 101 comprises a display portion 1011, a bonding portion 1013 bent to a back of the display panel 101, and a bending portion 1012 connecting the display portion 1011 and the bonding portion 1013.

The adhesive layer 103 is disposed between the display portion 1011 and the bonding portion 1013.

Specifically, the adhesive layer 103 is disposed between the first backplate 102 and the second backplate 104.

In the present embodiment, the adhesive layer 103 comprises: a first adhesive layer (not illustrated) disposed between the display portion and the bonding portion to facilitate bonding with the second backplate 104; a second adhesive layer (not illustrated) disposed between the first adhesive layer and the display portion to facilitate bonding with the first backplate 102; and an intermediate layer (not illustrated) disposed between the first adhesive layer and the second adhesive layer and mainly configured to serve as a buffer. A material of the intermediate layer comprises one of thermoplastic polyester or foam. The first adhesive layer and the second adhesive layer can be pressure sensitive adhesives (abbreviated as: PSA). In other embodiments, the adhesive layer 103 can also be a single-layer adhesive structure. A thickness of the adhesive layer 103 ranges from 50 μm to 300 μm.

The heat dissipation buffer layer 106 is disposed at one side of the display portion 1011 of the display panel 101 facing the bonding portion 1013, and is arranged at one side of the adhesive layer 103 away from the bending portion 1012. In detail, the heat dissipation buffer layer 106 is attached to a surface of the first backplate 102 facing the second backplate 104. A projection of the heat dissipation buffer layer 106 projected on the display portion 1011 does not overlap a projection of the adhesive layer 103 projected on the display portion 1011. In the present embodiment, there is a gap between the projection of the heat dissipation buffer layer 106 projected on the display portion 1011 and the projection of the adhesive layer 103 projected on the display portion 1011. That is to say, the heat dissipation buffer layer 106 is not disposed between the adhesive layer 103 and the first backplate 102. Therefore, a bending radius of the display device 100 of the present application is only determined by thicknesses of the first backplate 102, the second backplate 104, and the adhesive layer 103, regardless of a thickness of the heat dissipation buffer layer 106.

In fact, there is no necessary correlation between the thickness of the heat dissipation buffer layer 106 and the thickness of the adhesive layer 103. That is to say, the thickness of the heat dissipation buffer layer 106 can be greater than, less than, or equal to the thickness of the adhesive layer 103. As shown in FIG. 2, the thickness of the heat dissipation buffer layer 106 in the present embodiment is less than the thickness of the adhesive layer 103.

A material of the heat dissipation buffer layer 106 comprises one or more of a mesh adhesive, foam, copper foil, PI, or a graphite sheet.

A bending radius of the bending portion is r, the thickness of the adhesive layer 103 is h1, the thickness of the first backplate 102 is h2, and the thickness of the second backplate 104 is h3, wherein h1+h2+h3=2r. In the present embodiment, h1+h2+h3<0.5 mm.

The first backplate 102 is disposed between the adhesive layer 103 and the display portion 1011. The first backplate 102 comprises: a first substrate (not illustrated) disposed between the adhesive layer 103 and the display portion 1011; and a first polyester layer (not illustrated) disposed between the first substrate and the display portion 1011.

The second backplate 104 is disposed between the adhesive layer 103 and the binding portion 1013. The second backplate 104 comprises: a second substrate (not illustrated) disposed between the adhesive layer 103 and the bonding portion 1013; and a second polyester layer (not illustrated) disposed between the second substrate and the bonding portion 1013.

A width of the second backplate 104 is less than a width of the first backplate 102. The width of the second backplate 104 is greater than a width of the adhesive layer 103.

The third adhesive layer 105 is disposed on the bending portion 1012, a portion of the display portion 1011, and a portion of the bonding portion 1013. The third adhesive layer 105 mainly protects a shape of a bending region and prevents an external force from damaging the display panel in the bending region. A material of the third adhesive layer can be a UV adhesive.

In summary, the adhesive layer 103 in the present application is disposed between the display portion 1011 and the bonding portion 1013. The heat dissipation buffer layer 106 is disposed at one side of the display portion 1011 of the display panel 101 facing the bonding portion 1013. The projection of the heat dissipation buffer layer 106 projected on the display portion 1011 does not overlap the projection of the adhesive layer 103 projected on the display portion 1011. Therefore, a bending diameter of the display device 100 of the present application is equal to a sum of the thicknesses of the first backplate 102, the second backplate 104, and the adhesive layer 103. The bending diameter of the display device 100 of the present application is less than 0.5 mm. In conventional techniques, a bending diameter is equal to a sum of thicknesses of a first backplate, a second backplate, an adhesive layer, and a heat dissipation buffer layer. In contrast, the bending diameter of the display device 100 of the present application does not need to consider the thickness of the heat dissipation buffer layer 106. Accordingly, the bending radius of the display device 100 of the present application is less than a bending radius of a conventional display device. As a result, a bezel width of the display device 100 can be reduced to realize narrow bezels and improve product competitiveness.

However, the less the bending radius r, the greater a rebound force of the display panel 101 in the bending region. Therefore, viscosity of the adhesive layer 103 needs to be adjusted to meet anti-rebound requirements of the display panel 101. Specifically, the viscosity of the adhesive layer 103 can be improved by adjusting a material of the adhesive layer 103 or increasing the thickness of the adhesive layer 103. When increasing the thickness of the adhesive layer 103 to improve the viscosity of the adhesive layer 103, it is necessary to satisfy $h1+h2+h3=2r$, and $h1+h2+h3<0.5$ mm.

Specific examples are used in the present disclosures to illustrate the working principles and the embodiments of the present application. The above embodiments are only provided for ease of understanding the technical solutions and main ideas of the present application. Those of ordinary skill in the art can still modify the technical solutions described in the foregoing embodiments, or equivalently replace some of the technical features. These modifications or replacements should be deemed to be within the protection scope of the present application.

What is claimed is:

1. A display device, comprising:
   a display panel comprising a display portion, a bonding portion bent to a back of the display panel, and a bending portion connecting the display portion and the bonding portion;
   an adhesive layer disposed between the display portion and the bonding portion;
   a first backplate disposed between the adhesive layer and the display portion;
   a second backplate disposed between the adhesive layer and the bonding portion, wherein the adhesive layer is disposed between the first backplate and the second backplate; and
   a heat dissipation buffer layer disposed at one side of the display portion of the display panel facing the bonding portion;
   wherein an orthographic projection of the heat dissipation buffer layer projected on the display portion avoids overlapping an orthographic projection of the adhesive layer projected on the display portion,
   wherein a bending radius of the bending portion is r, a film thickness of the adhesive layer is h1, a film thickness of the first backplate is h2, a film thickness of the second backplate is h3, and $h1+h2+h3=2r$.

2. The display device according to claim 1, wherein the heat dissipation buffer layer is arranged at one side of the adhesive layer away from the bending portion.

3. The display device according to claim 1, wherein $h1+h2+h3<0.5$ mm.

4. The display device according to claim 1, wherein the adhesive layer comprises a first adhesive layer disposed between the display portion and the bonding portion.

5. The display device according to claim 4, wherein the adhesive layer further comprises:
   a second adhesive layer disposed between the first adhesive layer and the display portion; and
   an intermediate layer disposed between the first adhesive layer and the second adhesive layer;
   wherein a material of the intermediate layer comprises one of thermoplastic polyester or foam.

6. The display device according to claim 1, wherein the first backplate comprises:
   a first substrate disposed between the adhesive layer and the display portion; and
   a first polyester layer disposed between the first substrate and the display portion.

7. The display device according to claim 1, wherein the second backplate comprises:
   a second substrate disposed between the adhesive layer and the bonding portion; and
   a second polyester layer disposed between the second substrate and the bonding portion.

8. The display device according to claim 1, further comprising:
   a third adhesive layer disposed on the bending portion, a portion of the display portion, and a portion of the bonding portion.

* * * * *